(12) United States Patent
Chen et al.

(10) Patent No.: US 10,714,433 B2
(45) Date of Patent: Jul. 14, 2020

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Pu-Fang Chen, Hsinchu (TW); Shi-Chieh Lin, Hsinchu (TW); Victor Y. Lu, Foster City, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/981,133

(22) Filed: May 16, 2018

(65) Prior Publication Data

US 2019/0355670 A1 Nov. 21, 2019

(51) Int. Cl.
| | | |
|---|---|---|
| *H01L 23/12* | (2006.01) | |
| *H01L 23/00* | (2006.01) | |
| *H01L 23/544* | (2006.01) | |
| *H01L 21/48* | (2006.01) | |
| *H01L 21/56* | (2006.01) | |
| *H01L 23/498* | (2006.01) | |
| *H01L 23/31* | (2006.01) | |

(52) U.S. Cl.
CPC ......... *H01L 23/562* (2013.01); *H01L 21/486* (2013.01); *H01L 21/4853* (2013.01); *H01L 21/563* (2013.01); *H01L 23/3185* (2013.01); *H01L 23/49827* (2013.01); *H01L 23/49838* (2013.01); *H01L 23/544* (2013.01); *H01L 24/16* (2013.01); *H01L 2223/54493* (2013.01); *H01L 2224/16235* (2013.01); *H01L 2924/3512* (2013.01)

(58) Field of Classification Search
CPC . H01L 23/562; H01L 21/4853; H01L 21/486; H01L 21/563; H01L 23/3185; H01L 23/49827; H01L 23/49838; H01L 23/544; H01L 24/16; H01L 2223/54493; H01L 2224/16235; H01L 2924/3512
See application file for complete search history.

(56) References Cited

U.S. PATENT DOCUMENTS

| | | | |
|---|---|---|---|
| 2003/0094674 A1* | 5/2003 | Ipposhi | H01L 21/76254 257/627 |
| 2006/0208352 A1* | 9/2006 | Lee | H01L 21/563 257/701 |

(Continued)

*Primary Examiner* — Matthew C Landau
*Assistant Examiner* — Dmitriy Yemelyanov
(74) *Attorney, Agent, or Firm* — WPAT, P.C., Intellectual Property Attorneys; Anthony King (57) ABSTRACT

A method of manufacturing a semiconductor structure includes the following operations. A wafer with an orientation mark at a first crystal orientation represented by a family of Miller indices comprising <ijk> is provided, wherein $i^{2+}j^{2+}k^2=2$. A first chip and a second chip are connected to a first surface of the wafer. A first edge of the first chip and a second edge of the second chip are adjacent to each other. A boundary extending in a direction between the first edge and the second edge is formed. The direction is not parallel to the first crystal orientation.

20 Claims, 10 Drawing Sheets

(56) References Cited

U.S. PATENT DOCUMENTS

| | | | |
|---|---|---|---|
| 2007/0099402 A1* | 5/2007 | Tseng | H01L 23/544 438/489 |
| 2007/0145367 A1* | 6/2007 | Chen | H01L 24/29 257/49 |
| 2014/0339705 A1* | 11/2014 | Yee | H01L 21/76877 257/774 |
| 2016/0141228 A1* | 5/2016 | Leobandung | H01L 23/481 257/621 |

* cited by examiner

SEMICONDUCTOR STRUCTURE AND METHOD FOR MANUFACTURING THE SAME

BACKGROUND

In an attempt to further increase circuit density, three-dimensional (3D) ICs have been developed. For example, two dies are bonded together and electrical connections are formed between the two dies. The stacked dies are then bonded to a carrier substrate using wire bonds and conductive pads. In another example, a chip on chip on substrate (CoCoS) technique or a chip on wafer on substrate (CoWoS) technique is developed.

However, for example, in the CoWoS technique, while a plurality of chips are being bonded to a wafer, the wafer may exhibit a cracking issue along a direction parallel to the edges of the chips. The cracking issue may result from the bonding stress imposed on a relatively weaker crystal plane of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of present disclosure, a plurality of chips may be bonded on a wafer in a manner such that the edges of the chips are not parallel to a relatively weaker crystal plane (i.e., the {ijk} crystal plane in FIG. 2B, wherein $i^{2}+j^{2}+k^{2}=2$) of the wafer. As the edges of the chips are not parallel to the relatively weaker crystal plane, the bonding stress may not be directly imposed on the relatively weaker crystal plane. The cracking issue of the wafer may therefore be alleviated.

Figure 1:
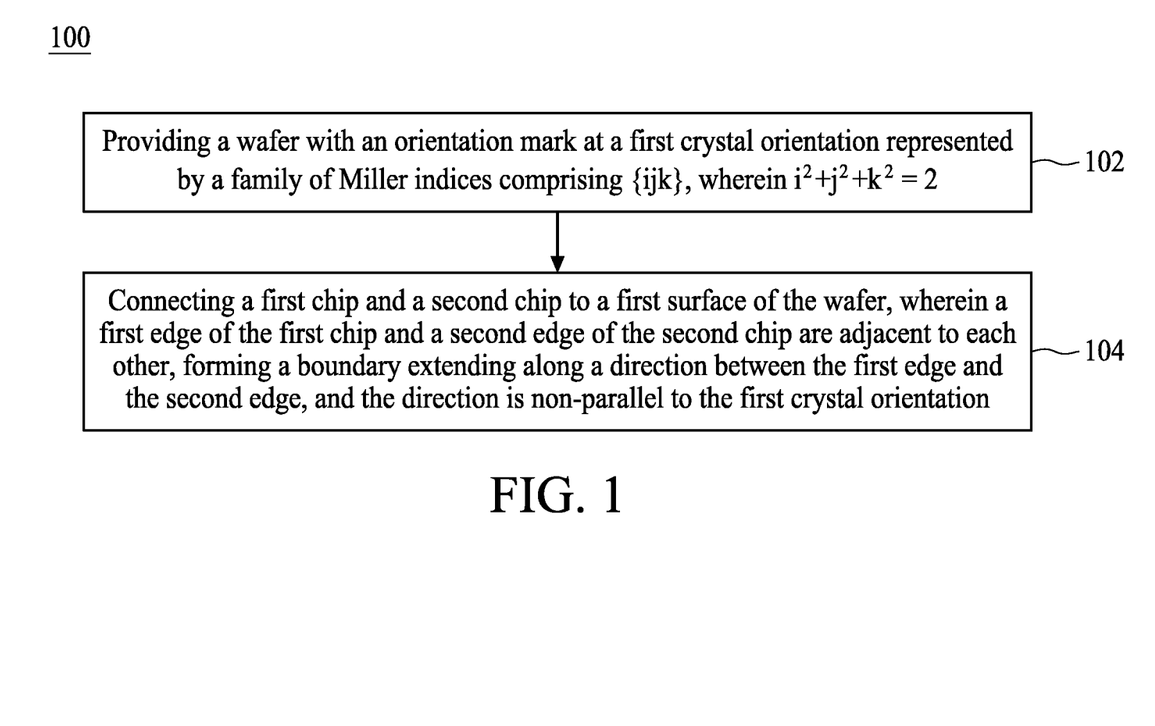
FIG. 1 is a flowchart illustrating a method for manufacturing a semiconductor structure in accordance with some embodiments of the present disclosure.

FIG. 1 is a flowchart illustrating a method for manufacturing a semiconductor structure in accordance with some embodiments of the present disclosure. In some embodiments, the method 100 includes operation 102 and operation 104. In operation 102, a wafer with an orientation mark at a first crystal orientation represented by a family of Miller indices comprising <ijk> is provided, wherein $i^{2}+j^{2}+k^{2}=2$. In operation 104, a first chip and a second chip are connected to the wafer. A first edge of the first chip and a second edge of the second chip are adjacent to each other. The first edge and the second edge form a boundary extending in a direction between the first edge and the second edge. The direction is not parallel to the first crystal orientation. The operations 102 and 104 are described in detail below.

Figure 2A:
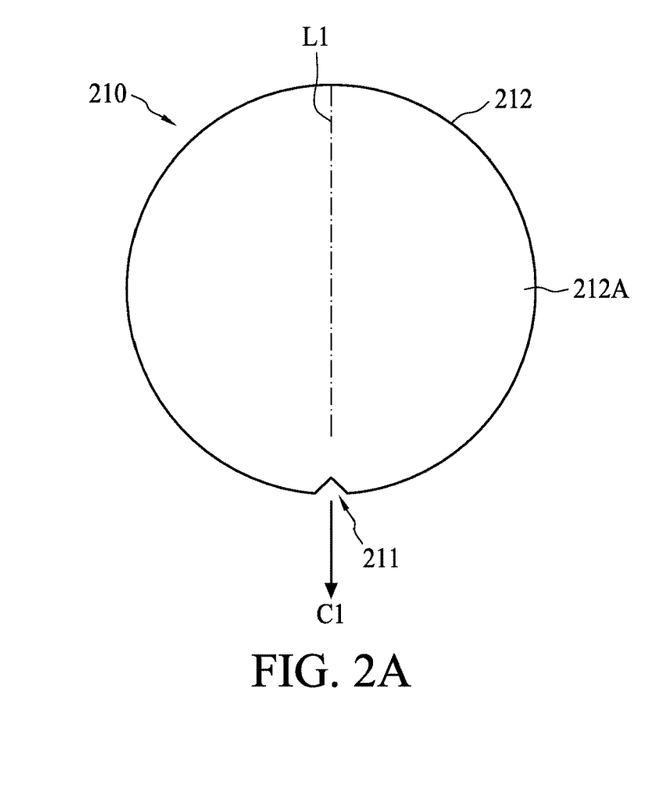
FIG. 2A is a top view of a wafer in accordance with some embodiments of the present disclosure.
Figure 2B:
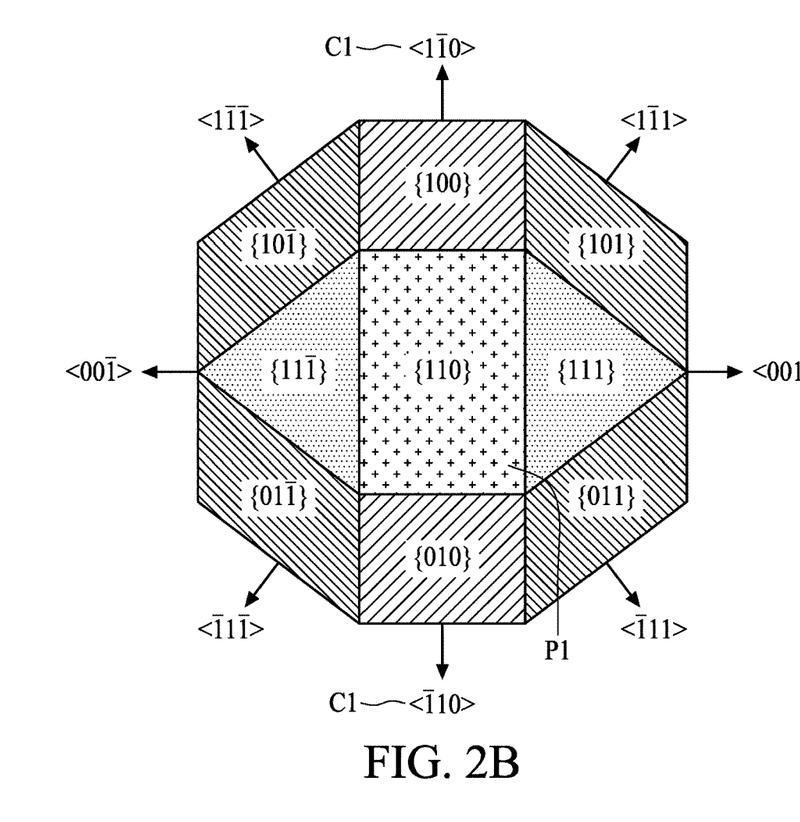
FIG. 2B is a perspective view of a structure of a silicon crystal illustrating crystal orientations in accordance with some embodiments of the present disclosure.

FIG. 2A is a top view of a wafer in accordance with some embodiments of the present disclosure. FIG. 2B is a perspective view of a structure of a silicon crystal illustrating crystal orientations in accordance with some embodiments of the present disclosure. Referring to FIG. 2A, FIG. 2B, and the operation 102 in FIG. 1, the wafer 210 is provided with an orientation mark 211 to indicate the crystal orientation C1. In some embodiments, the wafer 210 may include a body 212. The orientation mark 211 is disposed on the body 212. The body 212 may include silicon, silicon-on-insulator (SOI), silicon-on-sapphire (SOS), and other semiconductor materials. In one or more embodiments, the wafer 210 may function as an interposer.

According to some embodiments, the crystal orientations C1 are represented by a family of Miller indices comprising <ijk>, wherein $i^2+j^2+k^2=2$. The crystal orientations C1 include <110>, <$\bar{1}$10>, <1$\bar{1}$0>, <$\bar{1}\bar{1}$0>, <101>, <$\bar{1}$01>, <10$\bar{1}$>, <$\bar{1}$0$\bar{1}$>, <011>, <0$\bar{1}$1>, <01$\bar{1}$>, and <0$\bar{1}\bar{1}$>, wherein <$\bar{1}$> indicates <−1>. The shape of the orientation mark 211 is not limited. In some embodiments, the orientation mark 211 may be a triangularly-shaped notch or a parabolically-shaped notch. In other embodiments, the orientation mark 211 may be a flat edge.

It should be noted that the crystal orientation C1 (i.e., the <ijk> crystal orientation in FIG. 2A, wherein $i^2+j^2+k^2=2$) indicates the normal vector of the crystal plane P1 (i.e., the {ijk} crystal plane in FIG. 2B, wherein $i^2+j^2+k^2=2$). Specifically, the direction of the <ijk> crystal orientation is the direction of the normal vector of the {ijk} crystal plane. The orientation mark 211 is used as an alignment purpose during a manufacturing operation. According to some embodiments, the orientation mark 211 may also indicate a virtual line L1 parallel to one of the crystal orientations C1. The virtual line L1 may be parallel to one of the crystal orientations C1 (e.g., the <$\bar{1}$10> crystal orientation) and may be located on one of the crystal planes P1 (e.g., the {110} crystal plane). Specifically, any line on a first surface 212A of the body 212 that is parallel or perpendicular to the virtual line L1 is parallel to one crystal orientation C1 and is located on another crystal plane P1. Some of the crystal planes P1 are perpendicular to each other. For example, the {110} crystal plane and the {$\bar{1}$10} crystal plane are collectively included in the crystal planes P1, and the {110} crystal plane is perpendicular to the {$\bar{1}$10} crystal plane. According to some embodiments, an X-ray diffraction system may be used to identify the crystal planes of the wafer 210. This is merely an example and is not intended to be limiting.

Figure 3A:
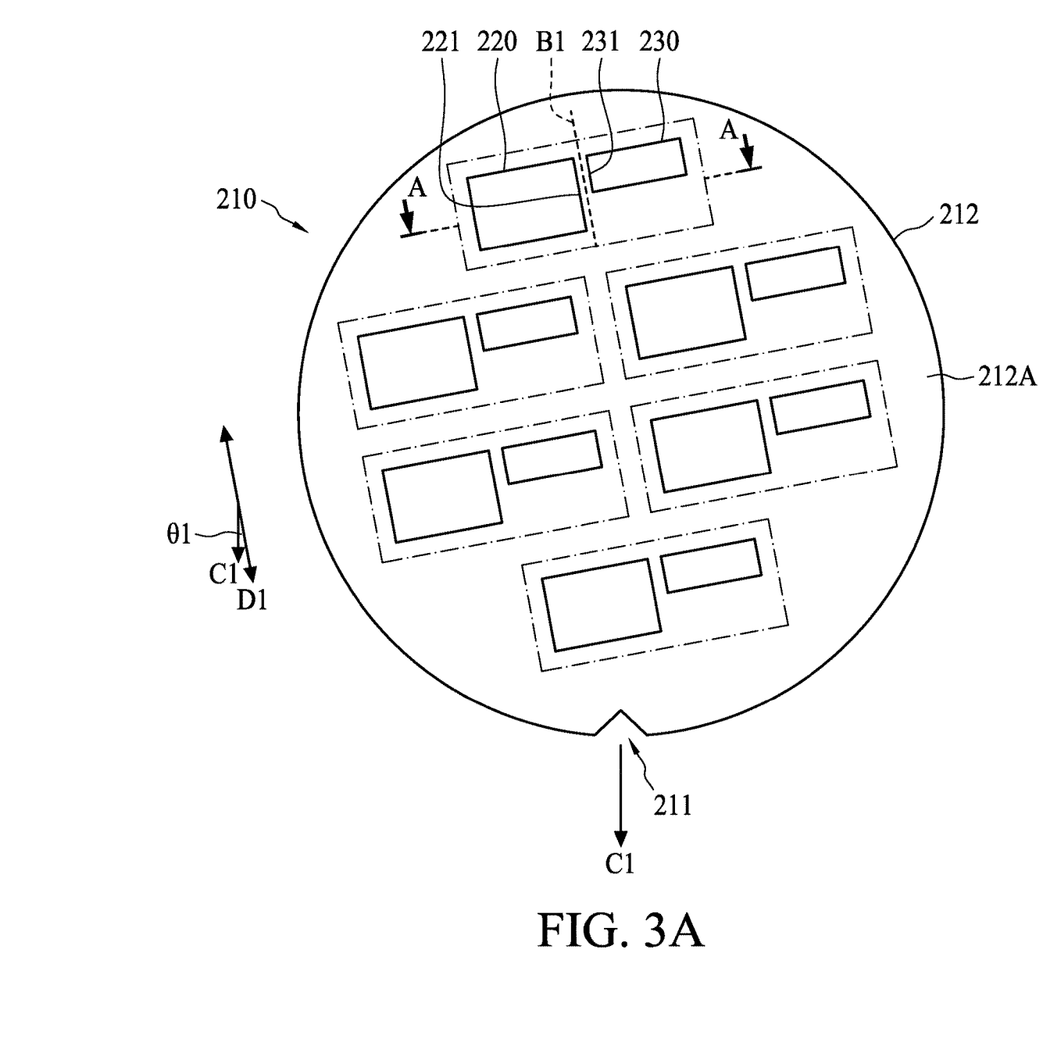
FIG. 3A is a top view of a step during an operation of manufacturing a semiconductor structure in accordance with some embodiments of the present disclosure.
Figure 3B:
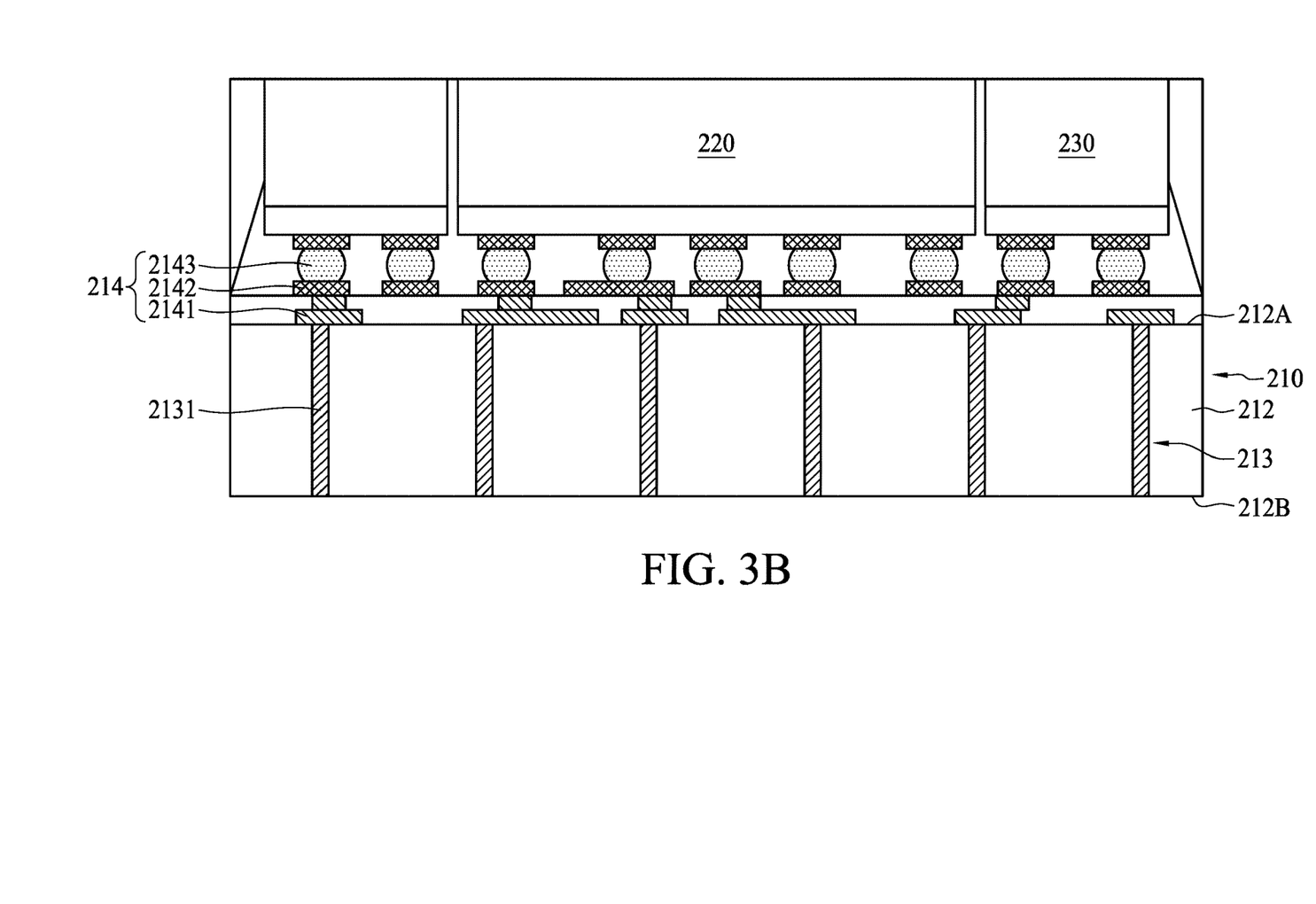
FIG. 3B is a cross-sectional view along line A-A of the semiconductor structure during the step shown in FIG. 3A.

FIG. 3A is a top view of a step during an operation of manufacturing a semiconductor structure in accordance with some embodiments of the present disclosure. FIG. 3B is a cross-sectional view along line A-A of the semiconductor structure during the operation shown in FIG. 3A. Referring to FIG. 3A, FIG. 3B, and the operation 104 in FIG. 1, according to some embodiments, a first chip 220 and a second chip 230 are connected to the wafer 210.

According to some embodiments, a plurality of interconnection structures 213 may be formed in the body 212 of the wafer 210. The interconnection structures 213 may include through substrate vias (TSVs) 2131 extending from a first surface 212A to a second surface 212B of the body 212. In some embodiments, the TSVs 2131 are also regarded as through interposer vias (TIV) if the wafer 210 is diced.

In some embodiments, a circuit 214 may be formed on the body 212 of the wafer 210. The circuit 214 may be a single layer structure or a multi-layer structure. If the circuit 214 is a multi-layer structure, circuit layer 214 may include, for example, a redistribution layer (RDL) 2141, one or more conductive pads 2142, and one or more conductive bumps 2143. Such layers are merely examples and are not intended to be limiting. The RDL 2141 is formed on the first surface 212A and may include patterned conductors for coupling with the TSVs 2131. The conductive pads 2142 are formed on the RDL 2141. The conductive bumps 2143 are formed on the conductive pads 2142.

The patterns of the interconnection structures 213 and the circuit layer 214 (collectively referred to below as the "patterns") may correspond to the bonding position of the first chip 220 and the second chip 230. The patterns may be formed in a manner such that the edge 221 of the first chip 220 and the edge 231 of the second chip 230 are not parallel to the crystal orientations C1 (i.e., the {ijk} crystal plane in FIG. 2B, wherein $i^2+j^2+k^2=2$). According to some embodiments, the patterns may be formed by changing the position of the mask (e.g., the glass photomask which allows light to selectively pass through) during the lithography operation. For example, the pattern on the mask is unchanged but the position of the mask is changed by a predetermined angle of rotation (i.e., rotating the mask by the predetermined angle). In other embodiments, the patterns may be formed by changing the position of the body 212 during the lithography operation. For example, the position of the body 212 may be changed by a predetermined angle of rotation (i.e., rotating the body 212 by the predetermined angle) before the lithography operation while the position of the mask remains unchanged. These are, of course, merely examples and are not intended to be limiting.

According to some embodiments, the first chip 220 and the second chip 230 are electrically connected to the circuit layer 214 and the interconnection structures 213 of the wafer 210. In some embodiments, the first chip 220 and the second chip 230 may be formed together on a substrate and connected to the wafer 210 without being diced into separate chips. In other embodiments, the first chip 220 and the second chip 230 may be formed together on a substrate and diced into separate chips, and then connected to the wafer 210. In other embodiments, the first chip 220 and the second chip 230 may be formed on separate substrates and diced into separate chips, and then connected to the wafer 210.

According to some embodiments, the first chip 220 and the second chip 230 are selected and combined for certain functions. The first chip 220 and the second chip 230 may be microprocessor devices with program memory storage such as Flash or EEPROM devices, or may be microprocessors with application specific processors such as baseband transceivers, graphics processors, cache memory devices, memory management devices, and analog to digital converters for sensor applications. In other embodiments, the first chip 220 may be a System-on-Chip (SoC) die and the second chip 230 may be a High Bandwidth Memory (HBM) die. These are merely examples and are not intended to be limiting.

In some embodiments, the first edge 221 of the first chip 220 and the second edge 231 of the second chip 230 are adjacent to each other. The first edge 221 is connected to a sidewall of the first chip 220. The first edge 221 may be substantially a straight line. The second edge 231 is connected to a sidewall of the second chip 230. The second edge 231 may be substantially a straight line. According to some embodiments, the first edge 221 and the second edge 231 form a boundary B1 extending in a direction D1.

The boundary B1 is a virtual line between the first edge 221 and the second edge 231. The boundary B1 is parallel to the first edge 221 and the second edge 231. The boundary B1 may be substantially a straight line. The location of the boundary B1 is not limited. According to some embodiments, the bonding stress between the first chip 220 and the second chip 230 may occur along the boundary B1.

The direction D1 may be indicated as a vector extending in both positive and negative directions (e.g., +x and −x directions in Cartesian coordinates). According to some embodiments, the direction D1 is not parallel to the crystal orientations C1 (i.e., the <ijk> crystal orientation in FIG. 2A, wherein $i^2+j^2+k^2=2$). A first included angle θ1 between the direction D1 and the crystal orientations C may be greater than 0 degrees and less than 90 degrees.

Accordingly, the boundary B1 extending in the direction D1 is not parallel to the crystal orientations C1. As mentioned above, the bonding stress may occur along the boundary B1, and, because the boundary B1 is not parallel to the crystal orientations C1, the bonding stress may not be directly imposed on the crystal planes P1 (i.e., the {ijk} crystal plane in FIG. 2B, wherein $i^2+j^2+k^2=2$). Specifically, for example, while the boundary B1 is not parallel to the <$\bar{1}$10> crystal orientation, the boundary B1 is also not parallel to the virtual line L1 (shown in FIG. 2A) indicated by the orientation mark 211. The boundary B1 is therefore not parallel to the {110} crystal plane on the first surface 210A. The bonding stress imposed on the {110} crystal plane may thus be alleviated. The {110} crystal plane is, of course, merely an example and is not intended to be limiting.

Figure 4:
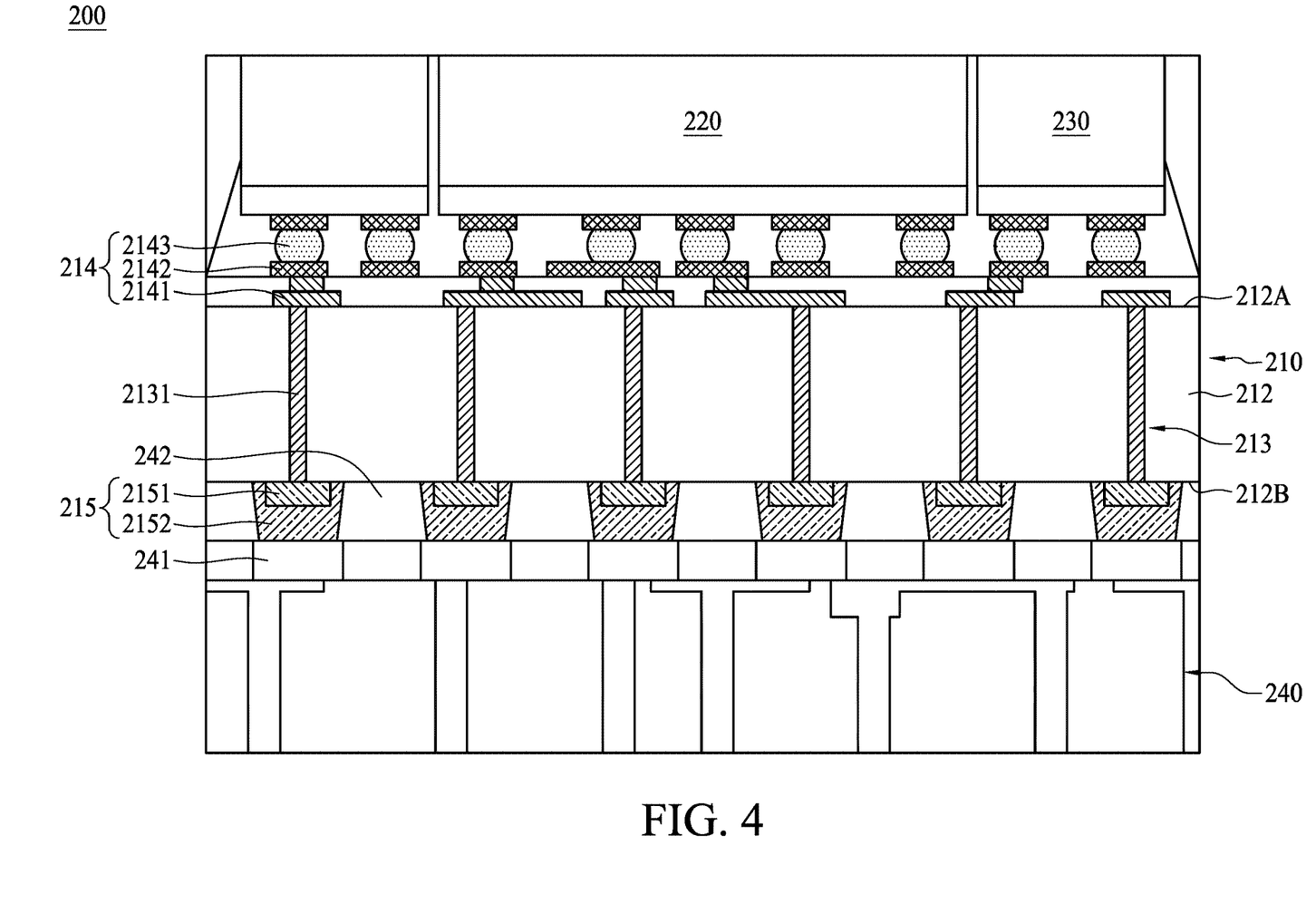
FIG. 4 is a semiconductor structure in accordance with some embodiments of the present disclosure.

FIG. 4 is a semiconductor structure in accordance with some embodiments of the present disclosure. According to some embodiments, the wafer 210 stacked with the first chip 220 and the second chip 230 is mounted on a substrate 240. According to some embodiments, before being mounted on the substrate 240, a plurality of conductive structures 215 between the second surface 212B of the body 212 and the substrate 240 are formed. The conductive structures 215 may include a plurality of conductive pads 2151 and a plurality of conductive bumps 2152. The plurality of conductive pads 2151 are formed on the second surface 212B of the body 212. The plurality of conductive bumps 2152 are respectively formed on the plurality of conductive pads 2151.

During the mounting operation with the substrate 240, the conductive bumps 2152 are in contact with the conductive pads 241 of the substrate 240. In some embodiments, a reflow operation is performed to soften the conductive bumps 2142 for electrical connection and mechanical attachment between the wafer 210 and the substrate 240. After the wafer 210 is connected to the substrate 240, an underfill layer 242 may be dispensed into gaps between the wafer 210 and the substrate 240. Accordingly, the semiconductor structure 200 including the wafer 210, the first chip 220, the second chip 230, and the substrate 240 is formed.

In some embodiments, the wafer 210 stacked with the first chip 220 and the second chip 230 may be diced before being mounted on the substrate 240. In other embodiments, the semiconductor structure 200 may be diced into packages after being mounted on the substrate 240. After being diced, the semiconductor structure 200 may be a CoWoS package.

According to some embodiments of the present disclosure, the first chip 220 and the second chip 230 are connected to the wafer 210 in a manner such that the boundary B1 between the first chip 220 and the second chip 230 is not parallel to the relatively weaker crystal planes P1 (i.e., the {ijk} crystal plane in FIG. 2B, wherein $i^2+j^2+k^2=2$) of the body 212. Because the boundary B1 between the first chip 220 and the second chip 230 is not parallel to the relatively weaker crystal orientation C1, the bonding stress may not be directly imposed on the relatively weaker crystal plane P1. The cracking issue of the body 212 of the wafer 210 may therefore be alleviated.

Figure 5A:
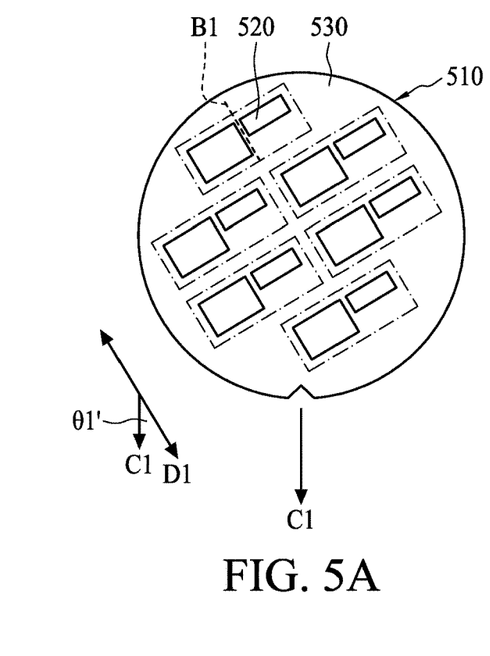
FIG. 5A, FIG. 5B, and FIG. 5C are top views of steps during an operation of manufacturing a semiconductor structure in accordance with some embodiments of the present disclosure.
Figure 5B:
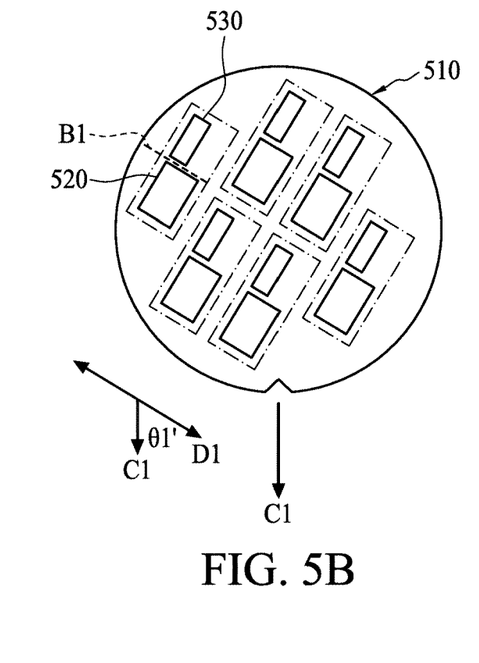
Figure 5C:
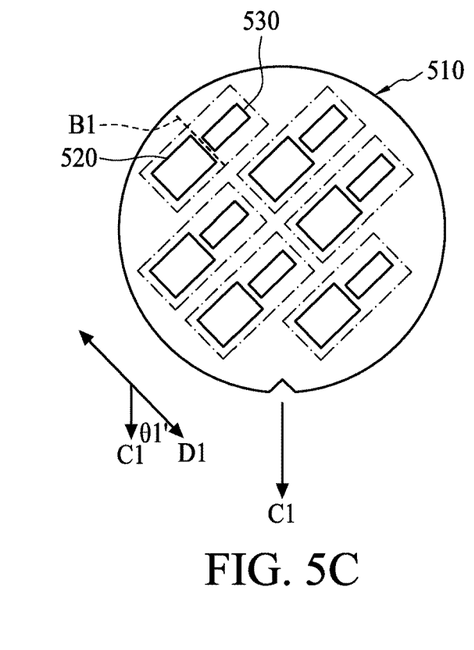

FIG. 5A, FIG. 5B, and FIG. 5C are top views of operations during an operation of manufacturing a semiconductor structure in accordance with some embodiments of the present disclosure. In some embodiments, the first included angle θ1' between the direction D1 and the crystal orientations C1 may be between about 30 degrees and about 60 degrees. Referring to FIG. 5A, the first included angle θ1' between the direction D1 and the crystal orientations C1 may be about 30 degrees. Referring to FIG. 5B, the first included angle θ1' between the direction D1 and the crystal orientations C1 may be about 60 degrees. Referring to FIG. 5C, the first included angle θ1' between the direction D1 and the crystal orientations C1 may be about 45 degrees. According to some embodiments, for example in FIG. 5C, when the first included angle θ1' is about 45 degrees, the bonding stress between the first chip 520 and the second chip 530 imposed on the crystal planes P1 (e.g., the {110} crystal plane) may be alleviated to about $1/\sqrt{2}$ (or about 70.7%) of the bonding stress of conventional designs. These are, of course, merely examples and are not intended to be limiting.

According to some embodiments, in the subsequent operation, the wafer 510 stacked with the first chip 520 and the second chip 530 in FIG. 5A, FIG. 5B, and FIG. 5C may be mounted on a substrate as illustrated in FIG. 4. Description of the subsequent operation is omitted for brevity.

Figure 6:
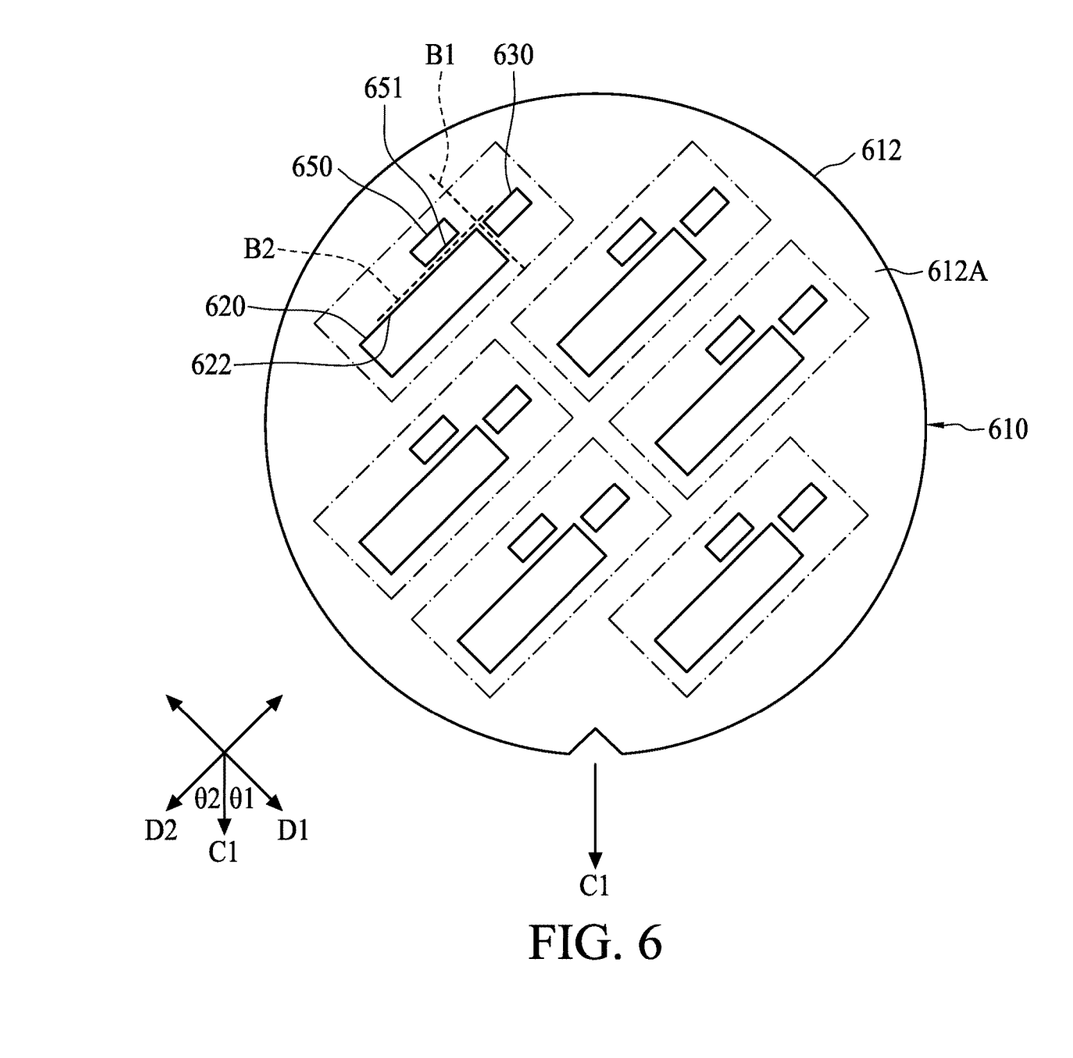
FIG. 6 is a top view of a step during an operation of manufacturing a semiconductor structure in accordance with some embodiments of the present disclosure.

FIG. 6 is a top view of a step during an operation of manufacturing a semiconductor structure in accordance with some embodiments of the present disclosure. According to some embodiments, the semiconductor structure may include a third chip 650 over the first surface 612A of the body 612. The second chip 630 and the third chip 650 may be disposed adjacent to different sides of the first chip 620. For example, the second chip 630 and the third chip 650 may be disposed adjacent to two connected sides, respectively, of the first chip 620. A third edge 651 of the third chip 650 is adjacent to a fourth edge 622 of the first chip 620. The third edge 651 and the fourth edge 622 form a boundary B2 extending in a direction D2. Characteristics of the boundary B2 are similar to those of the boundary B described with respect to FIG. 3A. FIG. 5A. FIG. 5B, or FIG. 5C; description of similar details is omitted in the interest of brevity. In some embodiments, the direction D2 may be perpendicular to the direction D1, and thus the boundary B2 may be perpendicular to the boundary B1. According to some embodiments, the first chip 620, the second chip 630, and the third chip 650 are selected and combined for certain functions similar to those of the first chip 220 and the second chip 230 in FIG. 3A and FIG. 3B, and description of such similar functions is omitted for brevity.

In some embodiments, a second included angle θ2 between the direction D2 and the crystal orientations C1 (i.e., the <ijk> crystal orientation in FIG. 2A, wherein $i^2+j^2+k^2=2$) is greater than 0 degree and less than 90 degrees. According to some embodiments, the first included angle θ1 (i.e., between the direction D1 and the crystal orientations C1) and the second included angle θ2 may be complementary angles. In one or more embodiments, the boundary B2 is not parallel to the relatively weaker crystal planes P1 (i.e., the {ijk} crystal plane in FIG. 2B, wherein $i^2+j^2+k^2=2$) of the body 612 of the wafer 610. Thus, the bonding stress between the third chip 650 and the first chip 620 may not be directly imposed on the relatively weaker crystal planes P of the body 612 of the wafer 610. Therefore, the cracking issue of the wafer 610 between the third chip 650 and the first chip 620 may be alleviated.

According to some embodiments, in the subsequent operation, the wafer 610 stacked with the first chip 620, the second chip 630, and the third chip 650 may be mounted on a substrate as described with respect to FIG. 4. Description of the subsequent operation is omitted for brevity.

Figure 7:
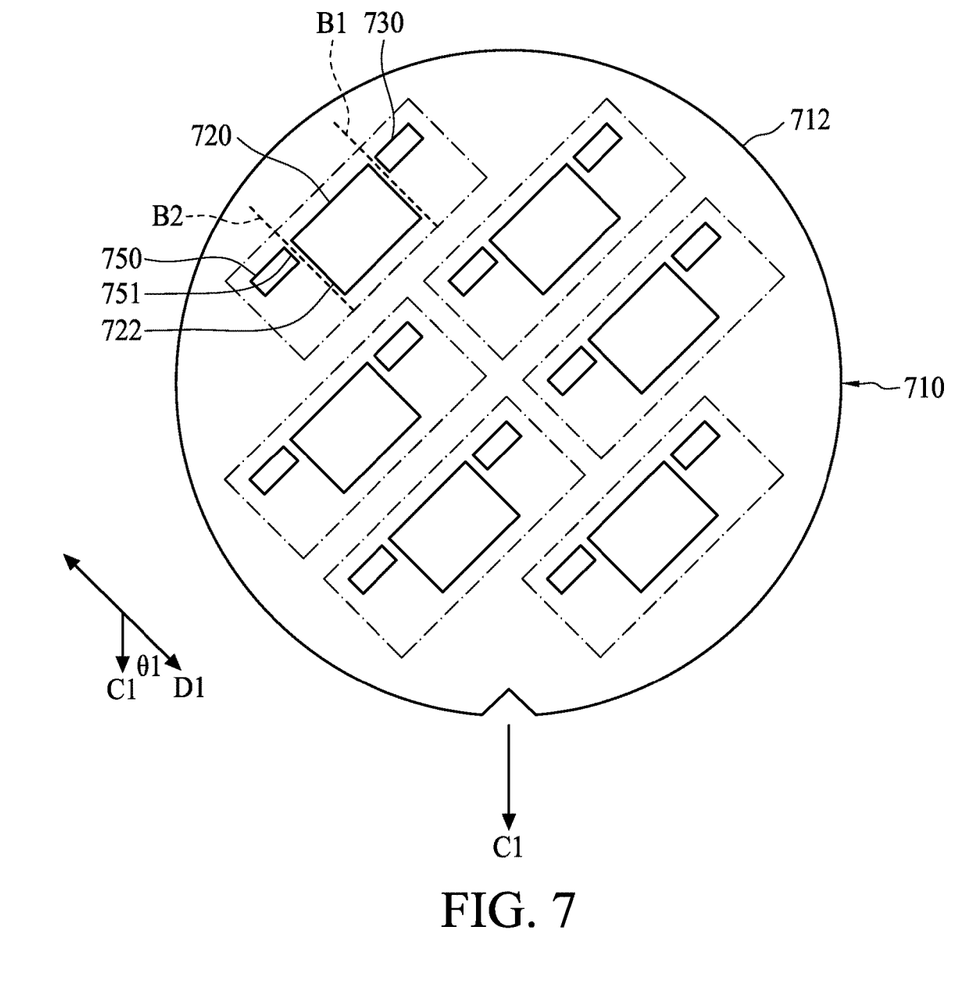
FIG. 7 is a top view of a step during an operation of manufacturing a semiconductor structure in accordance with some embodiments of the present disclosure.

FIG. 7 is a top view of a operation during the operation of manufacturing a semiconductor structure in accordance with some embodiments of the present disclosure. Unlike the embodiments illustrated in FIG. 6, in some embodiments, the second chip 730 and the third chip 750 may be disposed adjacent to two opposite sides, respectively, of the first chip 720 respectively. The boundary B2 between the third chip 750 and the first chip 720 may be parallel to the boundary B1. Features of the boundary B2 are similar to those of the boundary B1 described in FIG. 3A, FIG. 5A, FIG. 5B, or FIG. 5C. Thus, the bonding stress between the third chip 750 and the first chip 720 may not be directly imposed on the relatively weaker crystal planes P1 (i.e., the $\{ijk\}$ crystal plane in FIG. 2B, wherein $i^2+j^2+k^2=2$) of the body 712 of the wafer 710. The cracking issue of the wafer 710 between the third chip 750 and the first chip 720 may therefore be alleviated.

According to some embodiments, in the subsequent operation, the wafer 710 stacked with the first chip 720, the second chip 730, and the third chip 750 may be mounted on a substrate as described with respect to FIG. 4. Description of the subsequent operation is omitted for brevity.

Figure 8:
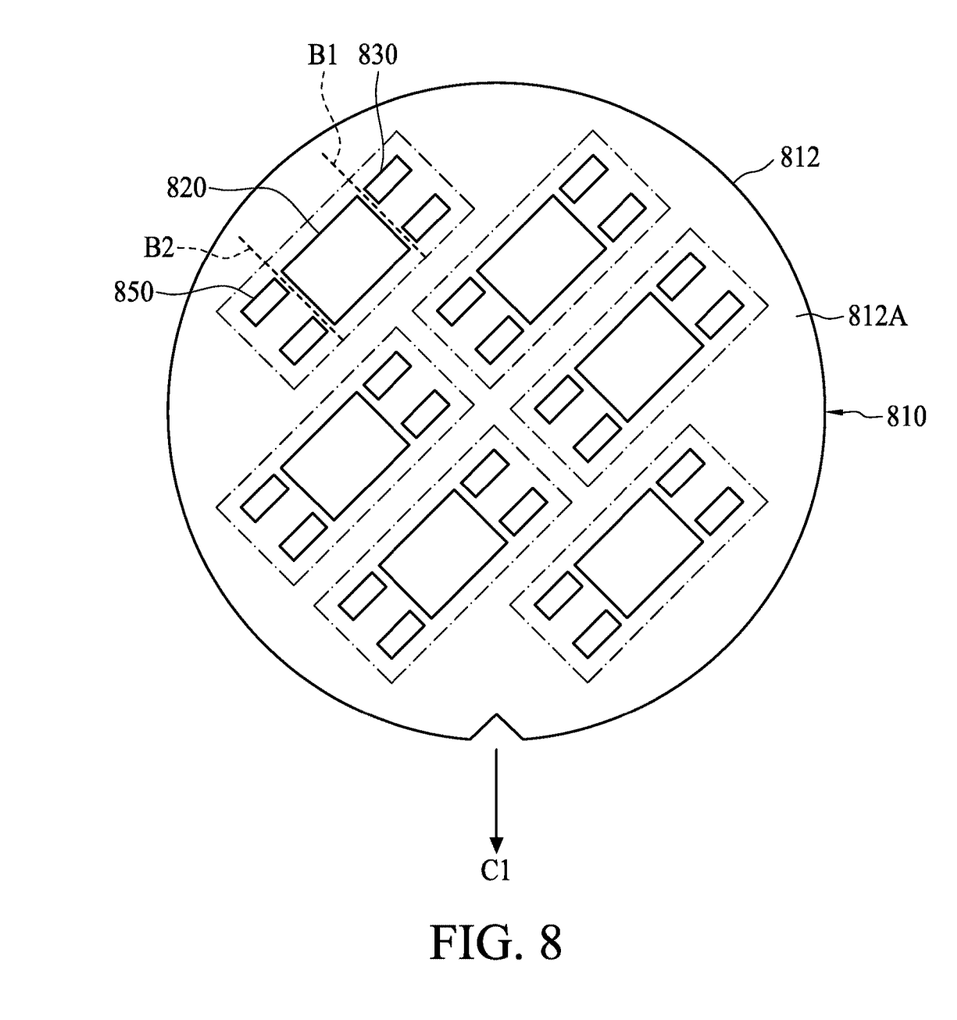
FIG. 8 is a top view of a step during an operation of manufacturing a semiconductor structure in accordance with some embodiments of the present disclosure.

FIG. 8 is a top view of a operation during the operation of manufacturing a semiconductor structure in accordance with some embodiments of the present disclosure. According to some embodiments, the semiconductor structure may include a plurality of second chips 830 and a plurality of third chips 850 over the first surface 812A of the body 812. Similar to the arrangement shown in FIG. 7, the second chips 830 and the third chips 850 may be disposed adjacent to two opposite sides, respectively, of the first chip 820. Features of the boundary B between the first chip 820 and the plurality of second chips 830, and features of the boundary B2 between the first chip 820 and the plurality of third chips 850, are similar to those described with respect to FIG. 7. The bonding stress between the second chips 830 and the first chip 820, and the bonding stress between the third chips 850 and the first chip 820 may not be directly imposed on the relatively weaker crystal planes P1 (i.e., the $\{ijk\}$ crystal plane in FIG. 2B, wherein $i^2+j^2+k^2=2$) of the body 812 of the wafer 810. Therefore, the cracking issue of the wafer 810 may be alleviated.

It should be noted that the plurality of second chips 830 and third chips 850 may also be disposed on the adjacent two connected sides of the first chip, similar to the arrangement shown in FIG. 6. Moreover, the plurality of second chips 830 and the plurality of third chips 850 may also be disposed adjacent to every side of the first chip. Features of such embodiments may be similar to those of a combination of FIG. 6 and FIG. 7, and the description of such similar features is omitted for brevity.

According to some embodiments, in the subsequent operation, the wafer 810 stacked with the first chip 820, the second chips 830, and the third chips 850 may be mounted on a substrate as described with respect to FIG. 4. Description of the subsequent operation is omitted for brevity.

Figure 9A:
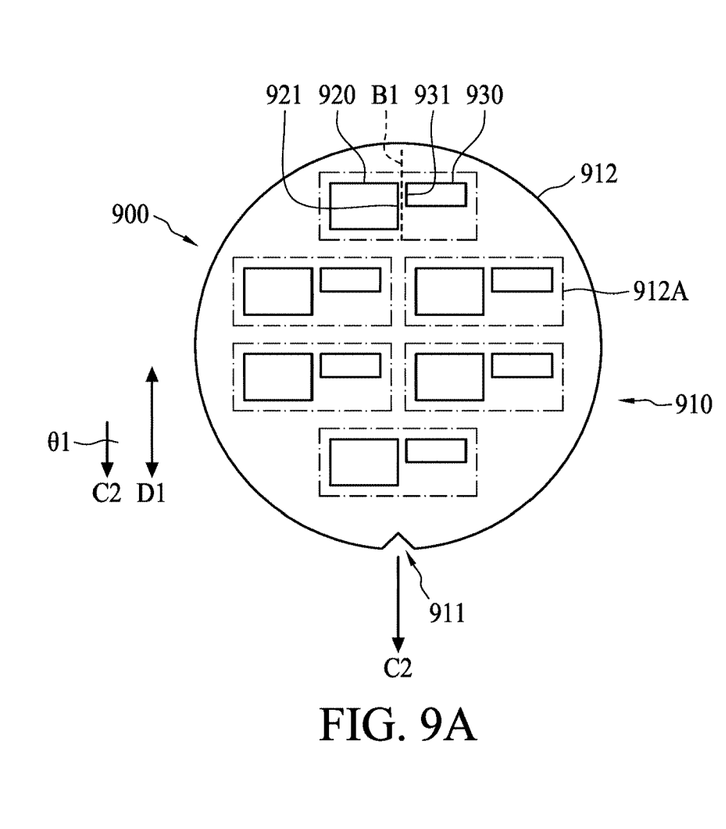
FIG. 9A is a top view of a step during an operation of manufacturing a semiconductor structure in accordance with some embodiments of the present disclosure.
Figure 9B:
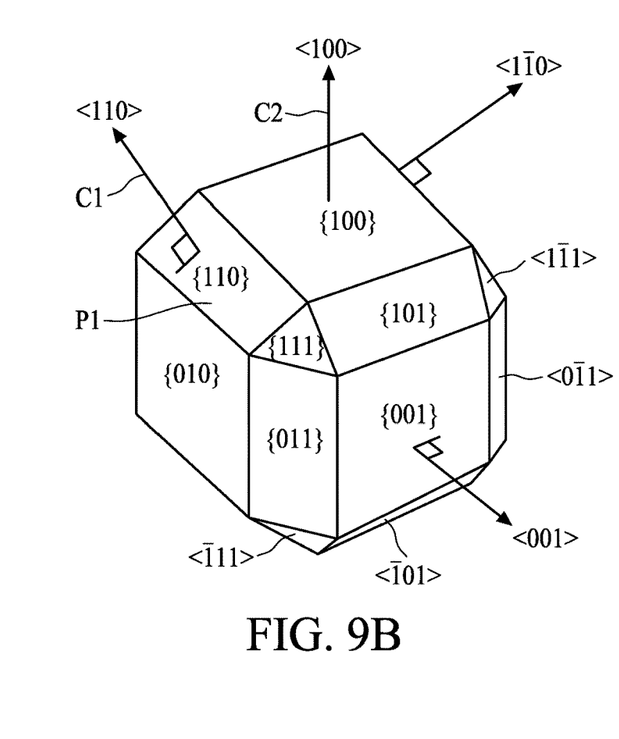
FIG. 9B is a perspective view of a structure of a silicon crystal illustrating crystal orientations in accordance with some embodiments of the present disclosure.

FIG. 9A is a top view of a step during an operation of manufacturing a semiconductor structure in accordance with some embodiments of the present disclosure. FIG. 9B is a perspective view of a structure of a silicon crystal illustrating crystal orientations in accordance with some embodiments of the present disclosure. According to some embodiments, the wafer 910 may have an orientation mark 911 at a crystal orientation C2. The crystal orientation C2 is represented by a family of Miller indices comprising $<lmn>$, wherein $l^2+m^2+n^2=1$. The crystal orientation C2 includes $<100>$, $<\bar{1}00>$, $<010>$, $<0\bar{1}0>$, $<001>$, and $<00\bar{1}>$, wherein $<\bar{1}>$ indicates $<-1>$.

In some embodiments, a first chip 920 and a second chip 930 are disposed over a first surface 912A of the body 912. A first edge 921 of the first chip 920 and a second edge 931 of the second chip 930 are adjacent to each other. According to some embodiments, the boundary B1 extending in the direction D1 between the first edge 921 and the second edge 931 is formed. A first included angle θ1 between the direction D1 and the crystal orientation C2 may be greater than or equal to 0 degree and less than 45 degrees.

The difference between the semiconductor structure 900 in FIG. 9A and the semiconductor structure 200 in FIG. 3A is that the orientation marks 211 and 911 are formed on different crystal orientations C1 and C2. The orientation mark 211 is formed on the crystal orientations C1 (i.e., the $<ijk>$ crystal orientation in FIG. 9B, wherein $i^2+j^2+k^2=2$) and the orientation mark 911 is formed on the crystal orientation C2 (i.e., the $<lmn>$ crystal orientation in FIG. 9B, wherein $l^2+m^2+n^2=1$). In some embodiments, an angle between the crystal orientations C1 (e.g., the $<110>$ crystal orientation) and the crystal orientation C2 (e.g., the $<100>$ crystal orientation) is 45 degrees. Therefore, when the boundary B between the first edge 921 and the second edge 931 is parallel to the crystal orientation C2 (i.e., the first included angle θ1 is equal to 0 degree in FIG. 9A), the boundary B1 is still not parallel to the relatively weaker crystal planes P1 (i.e., the $\{ijk\}$ crystal plane in FIG. 9B, wherein $i^2+j^2+k^2=2$). The bonding stress may not be directly imposed on the relatively weaker crystal planes P1 and the cracking issue of the wafer 910 may be alleviated.

It should be noted that the first included angle θ1 between the direction D1 and the crystal orientation C2 may not be equal to 45 degrees; however if such angle is equal to 45 degrees, then the boundary B1 between the first edge 921 and the second edge 931 may be parallel to the crystal orientations C1.

According to some embodiments, in the subsequent operation, the wafer 910 stacked with the first chip 920 and the second chip 930 may be mounted on a substrate as described with respect to FIG. 4. Description of the subsequent operation is omitted for brevity.

According to some embodiments, the semiconductor structure 900 may further include a third chip over the first surface 912A of the body 912 as described with respect to FIG. 6, FIG. 7, or FIG. 8. Further, the boundary between the third chip and the first chip 920 may be aligned corresponding to the crystal orientation C2. The specific descriptions are similar to those of FIG. 6, FIG. 7, or FIG. 8, and are omitted herein for brevity.

According to some embodiments of present disclosure, the first chip 920 and the second chip 930 are bonded on the body 912 of the wafer 910 in a manner such that the boundary B between the first chip 920 and the second chip 930 is aligned corresponding to the crystal orientation C2 (i.e., the $<lmn>$ crystal orientation in FIG. 9B, wherein $l^2+m^2+n^2=1$) of the body 912. As the crystal orientation C2 is not parallel to the relatively weaker crystal orientation C1 (i.e., the $<ijk>$ crystal orientation in FIG. 9A, wherein $i^2+j^2+k^2=2$), the bonding stress may not be directly imposed on the relatively weaker crystal plane P1 (i.e., the $\{ijk\}$ crystal plane in FIG. 9B, wherein $i^2+j^2+k^2=2$). The cracking issue of the wafer 910 may therefore be alleviated.

According to one embodiment of the present disclosure, a method of manufacturing a semiconductor structure is provided. The method includes the following operations. A wafer with an orientation mark at a first crystal orientation represented by a family of Miller indices comprising $<ijk>$ is provided, wherein $i^2+j^2+k^2=2$. A first chip and a second chip are connected to a first surface of the wafer. A first edge of the first chip and a second edge of the second chip are adjacent to each other. A boundary extending in a direction between the first edge and the second edge is formed. The direction is not parallel to the first crystal orientation.

According to another embodiment of the present disclosure, a semiconductor structure is provided. The semiconductor structure includes a wafer and a first chip. The wafer includes a crystal orientation represented by a family of Miller indices comprising <ijk>, wherein $i^2+j^2+k^2=2$. The first chip is disposed over the wafer, wherein a first edge of the first chip is arranged in a direction, and the direction is not parallel to the crystal orientation.

According to another embodiment of the present disclosure, a semiconductor structure is provided. The semiconductor structure includes a wafer, a first chip and a second chip. The wafer includes a crystal orientation represented by a family of Miller indices comprising <lmn>, wherein $l^2+m^2+n^2=1$. The first chip and the second chip are disposed over the wafer, wherein a first edge of the first chip and a second edge of the second chip are adjacent to each other. A first boundary extending in a first direction between the first edge and the second edge is formed. A first included angle between the first direction and the crystal orientation is greater than or equal to 0 degree and less than 45 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a wafer comprising a crystal orientation represented by a family of Miller indices comprising <ijk>, wherein $i^2+j^2+k^2=2$;
   a circuit layer; and
   a first chip mounted on the wafer through the circuit layer, wherein a first edge of the first chip is arranged in a direction, the direction is not parallel to the crystal orientation, and the first chip includes a plurality of conductive pads facing and electrically connected to the circuit layer.

2. The semiconductor structure of claim 1, wherein an included angle between the direction and the crystal orientation is greater than 0 degree and less than 90 degrees.

3. The semiconductor structure of claim 2, wherein the included angle between the direction and the crystal orientation is between about 30 degrees and about 60 degrees.

4. The semiconductor structure of claim 3, wherein the included angle between the direction and the crystal orientation is about 45 degrees.

5. The semiconductor structure of claim 1, further comprising a second chip over the wafer, wherein a second edge of the second chip is adjacent to the first edge, forming a boundary extending in the direction between the first edge and the second edge.

6. The semiconductor structure of claim 1, wherein the wafer comprises
   a body;
   wherein the circuit layer is formed over a first surface of the body, and electrically connected to the first chip.

7. The semiconductor structure of claim 6, further comprising a substrate connected to a second surface of the body.

8. The semiconductor structure of claim 7, further comprising:
   a plurality of conductive structures between the second surface and the substrate; and
   an underfill layer between the second surface and the substrate.

9. A semiconductor structure, comprising:
   a wafer comprising a crystal orientation represented by a family of Miller indices comprising <ijk>, wherein $i^2+j^2+k^2=2$;
   a plurality of conductive pads and a plurality of conductive bumps;
   a first chip and a second chip mounted on the wafer through the plurality of conductive pads and the plurality of conductive bumps, wherein a first edge of the first chip and a second edge of the second chip are adjacent to each other, forming a boundary extending in a direction between the first edge and the second edge, and an included angle between the direction and the crystal orientation is greater than 0 degree and less than 90 degrees; and
   a plurality of interconnection structures in a body of the wafer.

10. The semiconductor structure of claim 9, wherein a pattern of the interconnection structures is corresponding to a bonding position of the first chip and the second chip.

11. The semiconductor structure of claim 9, wherein the first chip and the second chip are electrically connected to the interconnection structures through the plurality of conductive pads and the plurality of conductive bumps.

12. The semiconductor structure of claim 9, wherein the interconnection structures comprise through substrate vias extending from a first surface of the body of the wafer to a second surface of the body of the wafer.

13. The semiconductor structure of claim 12, further comprising a redistribution layer formed on the first surface of the body of the wafer for coupling with the through substrate vias.

14. The semiconductor structure of claim 13, wherein the plurality of conductive pads are formed on the redistribution layer.

15. The semiconductor structure of claim 9, wherein the wafer stacked with the first chip and the second chip is mounted on a substrate.

16. A semiconductor structure, comprising:
   a wafer comprising a crystal orientation represented by a family of Miller indices comprising <ijk>, wherein $i^2+j^2+k^2=2$;
   a circuit layer; and
   a first chip, a second chip and a third chip electrically connected to the wafer through the circuit layer, wherein the second chip and the third chip are disposed adjacent to different sides of the first chip, a first boundary is formed between the second chip and the first chip extending in a first direction, and a second boundary is formed between the third chip and the first chip extending in a second direction, a first included angle between the first direction and the crystal orientation is greater than 0 degree and less than 90 degrees, a second included angle between the second direction and the crystal orientation is greater than 0 degree and less than 90 degrees, and the circuit layer is between the first chip and the wafer, between the second chip and the wafer and between the third chip and the wafer.

17. The semiconductor structure of claim 16, wherein the second chip and the third chip are disposed adjacent to two opposite sides.

18. The semiconductor structure of claim 16, wherein the second boundary is parallel to the first boundary.

19. The semiconductor structure of claim 16, wherein the first included angle and the second included angle are complementary angles.

20. The semiconductor structure of claim 16, wherein the second direction is perpendicular to the first direction.

* * * * *